US008208679B2

(12) United States Patent
Opitz

(10) Patent No.: US 8,208,679 B2
(45) Date of Patent: Jun. 26, 2012

(54) TRANSDUCER MEMBRANE WITH SYMMETRICAL CURVATURE

(75) Inventor: Martin Opitz, Vienna (AT)

(73) Assignee: AKG Acoustics GmbH, Vienna (AT)

( * ) Notice: Subject to any disclaimer, the term of this patent is extended or adjusted under 35 U.S.C. 154(b) by 1217 days.

(21) Appl. No.: 11/832,195

(22) Filed: Aug. 1, 2007

(65) Prior Publication Data

US 2008/0024036 A1 Jan. 31, 2008

(30) Foreign Application Priority Data

Feb. 18, 2005 (EP) .................................... 05450034
Feb. 16, 2006 (EP) .................. PCT/EP2006/001438

(51) Int. Cl.
*H04R 1/00* (2006.01)
*H04R 1/02* (2006.01)
*H04R 25/00* (2006.01)
*H01L 41/00* (2006.01)

(52) U.S. Cl. ........ 381/430; 310/311; 381/150; 381/386; 381/398; 381/433

(58) Field of Classification Search .................. 381/430, 381/150, 386, 398, 433; 310/311
See application file for complete search history.

(56) References Cited

U.S. PATENT DOCUMENTS 3,612,783 A 10/1971 Schneider et al.
3,780,232 A 12/1973 Ward
3,834,486 A 9/1974 Tsuge et al.
3,858,680 A * 1/1975 Tsuge et al. ................. 181/172
3,946,832 A 3/1976 Takano et al.
3,997,023 A * 12/1976 White .......................... 181/171
4,122,314 A * 10/1978 Matsuda et al. .............. 381/425
4,140,203 A * 2/1979 Niguchi et al. ............... 181/167
4,319,098 A 3/1982 Baitcher
4,478,309 A 10/1984 Kawamura et al.
4,554,414 A 11/1985 House
4,796,725 A * 1/1989 Katayama ..................... 181/142
5,008,945 A 4/1991 Murayama et al.
5,319,718 A * 6/1994 Yocum .......................... 381/398
5,590,211 A * 12/1996 Chang ........................... 381/398
5,734,734 A 3/1998 Proni
5,949,898 A * 9/1999 Proni ............................ 381/398
6,026,929 A * 2/2000 Faraone ........................ 181/173
6,072,112 A * 6/2000 Suenaga et al. .............. 84/422.3
6,111,969 A * 8/2000 Babb ............................ 381/396
6,185,809 B1 * 2/2001 Pavlovic ......................... 29/594
(Continued)

FOREIGN PATENT DOCUMENTS

EP 1515582 A1 3/2005
(Continued)

OTHER PUBLICATIONS

"The Ultimate Binaural Experience," AKG Acoustics, AKG Acoustics GmbH, a Harman International Company, Vienna/Austria, Jan. 2004.

(Continued)

*Primary Examiner* — Jeffrey Donels
*Assistant Examiner* — Christina Russell
(74) *Attorney, Agent, or Firm* — Brinks Hofer Gilson & Lione

(57) ABSTRACT

A transducer membrane enhances sound reproduction. Curved portions of the membrane periphery contribute to the enhanced sound reproduction. The transducer membrane may add or improve sound reproduction capability in cell phones, gaming systems, personal data assistants, or other devices.

27 Claims, 9 Drawing Sheets

U.S. PATENT DOCUMENTS

| | | | | |
|---|---|---|---|---|
| D442,166 | S | 5/2001 | Schmidt | |
| 6,320,972 | B1 * | 11/2001 | Goller | 381/430 |
| 6,351,543 | B1 | 2/2002 | Lenhard-Backhaus et al. | |
| 6,510,231 | B2 | 1/2003 | Barnert | |
| 6,587,570 | B1 * | 7/2003 | Pavlovic | 381/400 |
| 6,622,820 | B2 | 9/2003 | Pavlovic | |
| 6,639,991 | B2 | 10/2003 | Lehdorfer | |
| D481,709 | S | 11/2003 | Solderits | |
| 6,668,066 | B2 | 12/2003 | Pribyl | |
| 6,724,910 | B1 * | 4/2004 | Heed et al. | 381/423 |
| 2003/0112995 | A1 * | 6/2003 | Frasl | 381/398 |
| 2003/0219141 | A1 * | 11/2003 | Sugata et al. | 381/430 |
| 2005/0180588 | A1 * | 8/2005 | Opitz | 381/150 |
| 2006/0162993 | A1 * | 7/2006 | Honda et al. | 181/172 |

FOREIGN PATENT DOCUMENTS

| | | | |
|---|---|---|---|
| EP | 1694094 | A1 | 8/2006 |
| JP | 59094995 | A2 | 5/1984 |
| JP | 61121690 | | 6/1986 |
| JP | 61123390 | | 6/1986 |
| JP | 62265894 | | 11/1987 |
| JP | 11205895 | A * | 7/1999 |
| JP | 11205895 | A2 | 7/1999 |
| WO | WO2006/087202 | A1 | 8/2006 |

OTHER PUBLICATIONS

AKG Acoustics K 1000 Service Guide, AKG Acoustics GmbH, Wien, Austria, issued Nov. 1990.

AKG Acoustics K1000 Instruction Manual, introduction by Dr. Carl Poldy, undated.

* cited by examiner

TRANSDUCER MEMBRANE WITH SYMMETRICAL CURVATURE

BACKGROUND OF THE INVENTION

1. Priority Claim

This application claims the benefit of priority from PCT Application No. PCT/EP2006/001438, filed Feb. 16, 2006, and European Patent Application No. EP 05450034.3, filed Feb. 18, 2005.

2. Technical Field

This application relates to a transducer membrane, and more particularly to a transducer membrane that reduces acoustic distortions.

3. Related Art

Audio speakers act as transducers that convert electrical energy in an audio signal to acoustic energy. Small audio speakers may be incorporated into mobile telephones, speaker phones, headphones, personal data assistants, portable gaming systems, and other devices. In some applications, the transducer includes a transducer membrane that deforms to produce sound. When the deformations are nonlinear, however, the deformations may produce acoustic distortions noticeable by a listener. Therefore, a need exits for an improved transducer that reduces acoustic distortions resulting from nonlinear deformation in a transducer membrane.

SUMMARY

A transducer membrane provides enhanced sound reproduction. Curved portions of the membrane periphery contribute to the enhanced sound reproduction. The transducer membrane may add or improve sound reproduction capability in cell phones, gaming systems, personal data assistants, or other devices.

The transducer membrane has a construction that linearizes deformations in the transducer membrane, thereby reducing acoustical distortions. The transducer membrane may include a dome. An intermediate membrane may be formed around or coupled to some/or all of the dome. A periphery surrounding the intermediate membrane defines a non-circular footprint of the transducer membrane. The periphery includes a first periphery corner and a second periphery corner. A first periphery segment includes a deformation linearizing curvature disposed between the first periphery corner and the second periphery corner. A second periphery segment includes a symmetrical curvature with respect to the first periphery segment.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The technology may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
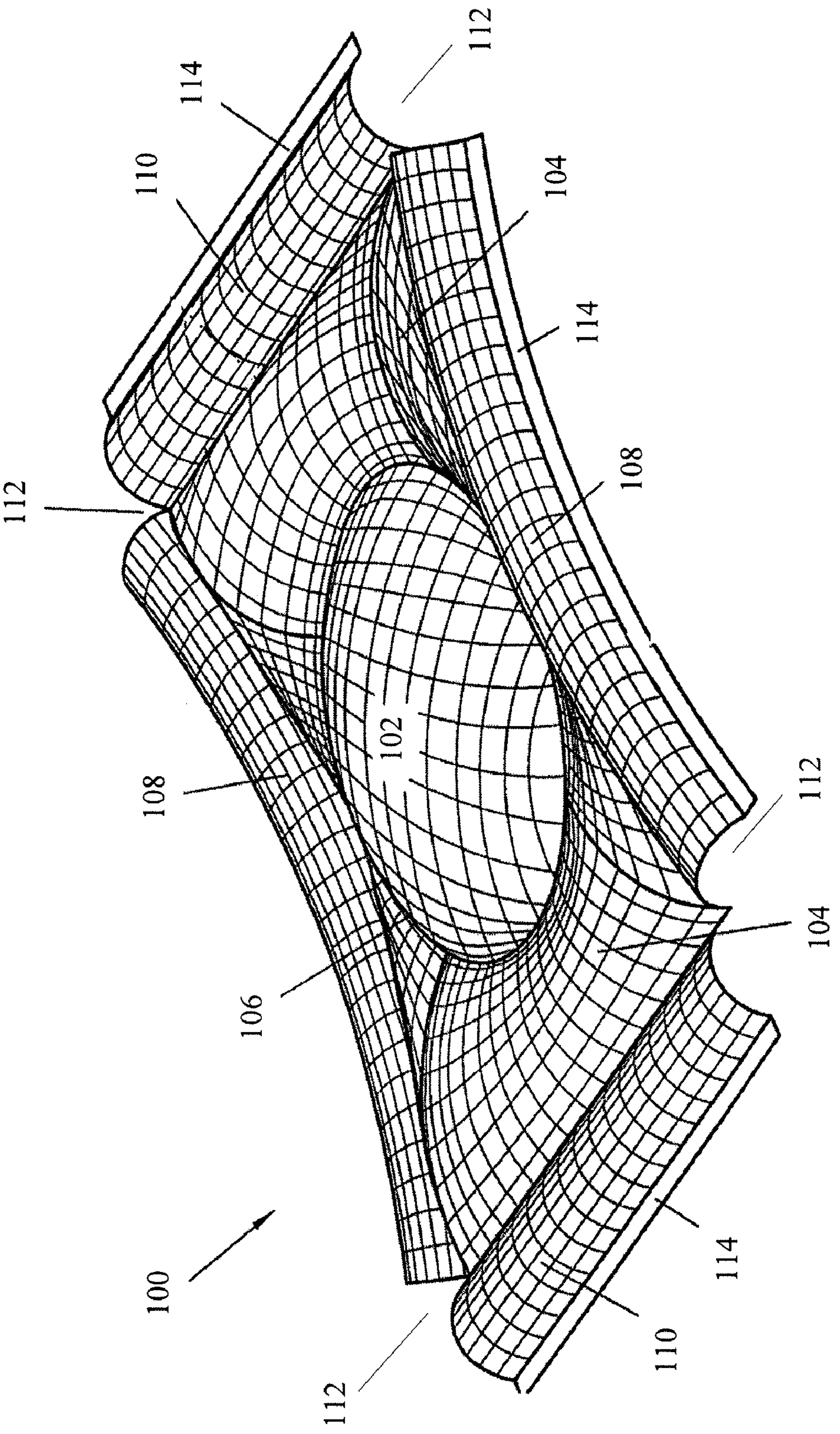
FIG. 1 is a perspective view of a transducer membrane.

FIG. 1 is a perspective view of a transducer membrane 100. The transducer membrane 100 includes a dome 102 that may be positioned near the center of the transducer membrane 100. Alternatively, the dome 102 may be positioned in other locations of the transducer membrane 100. An intermediate membrane 104 may be formed around or coupled to some/or all of the dome 102, and may be delineated by a groove or ring 106. A periphery may surround the intermediate membrane 104, and may extend around the intermediate membrane 104 to define a non-circular footprint of the transducer membrane 100. The periphery may include periphery segments 108 and 110. Periphery segments 108, as shown in FIG. 1, are symmetrically curved, in the footprint plane, with respect to one another. The periphery may also include periphery corners 112. The periphery corners 112 may be a location along the periphery where two periphery segments meet or end. In some applications, the periphery corners 112 may be open. In other implementations, the periphery corners 112 may be closed with transducer material that forms a continuous or discontinuous extension of the periphery segments to transition from one segment to the next. The transducer material closing the periphery corners 112 may be a membrane or a membrane like material that may include ridges and/or grooves. The ridges and/or grooves may reduce acoustic short-circuit artifacts, and may be included, for example, when an acoustical short circuit is noticeable in the emitted sound field. The decision to close the periphery corners 112 may depend on the extent to which an acoustical short circuit is noticeable in an emitted sound field.

The dome 102 may have a circular, elliptical, or polygonal footprint. A coil may be coupled to an underside of the dome 102. In some applications, the coil may be glued to the dome 102. Alternatively, the coil may be attached to the dome 102 with a fastener, clamp, or other coupling.

The coil may carry signal current supplied by sound reproduction circuitry. The interaction of the signal current in the coil and a surrounding magnetic field may impart a reciprocating motion in the transducer membrane 100 near a center portion to produce acoustic energy. The center portion of the membrane 100 may move like a rigid piston and may cause deformations in the intermediate membrane 104 and/or periphery.

The periphery segments 108 and 110 may be formed along an outer portion of the transducer membrane 100. The periphery segments 108 and 110 may include an adhesive edge 114. Adhesive may be applied to the adhesive edge 114 and may secure the outer edge of a periphery segment 108 or 110 to another structure, such as a loudspeaker frame. Alternatively, the membrane 100 may be secured in place by other manners, such as by a fastener, a clamp, or other coupling.

The periphery segments 108 and 110 may have a cross-sectional curvature or may have no curvature. The curvature may give a periphery segment 108 or 110 a height between about zero (e.g., flat) and about half of the width of the corresponding periphery segment. Alternatively, the curvature height may be larger than the width of the corresponding periphery segment. The cross-sectional curvature of one or more of the periphery segments 108 and/or 110 may be substantially semicircular, substantially elliptical, helix shaped, or otherwise curved. In some applications, the cross-sectional curvature of the periphery segments 108 and/or 110 may be in a direction opposite a cross-sectional curvature of the dome 102.

At least two periphery segments may be symmetrically curved with respect to one another in the footprint plane. In FIG. 1, the periphery segments 108 are symmetrically curved with respect to each other in the footprint plane, while the periphery segments 110 are approximately straight. Periphery segments 108 are also symmetrically curved with respect to the dome 102. In FIG. 1, periphery segments 108 are convexly curved with respect to the dome 102. Alternatively, periphery segments 108 may be concavely curved with respect to the dome 102. In yet other implementations, more than two periphery segments may be curved in the footprint plane.

The intermediate membrane 104 may run along all or part of the periphery. In FIG. 1, the intermediate membrane 104 runs along the inside of periphery segments 108 and 110 and between the ring 106. The intermediate membrane 104 may also taper away as it reaches a border region where a periphery segment reaches, meets, joins, merges, or connects with the dome 102 or the ring 106.

Figure 2:
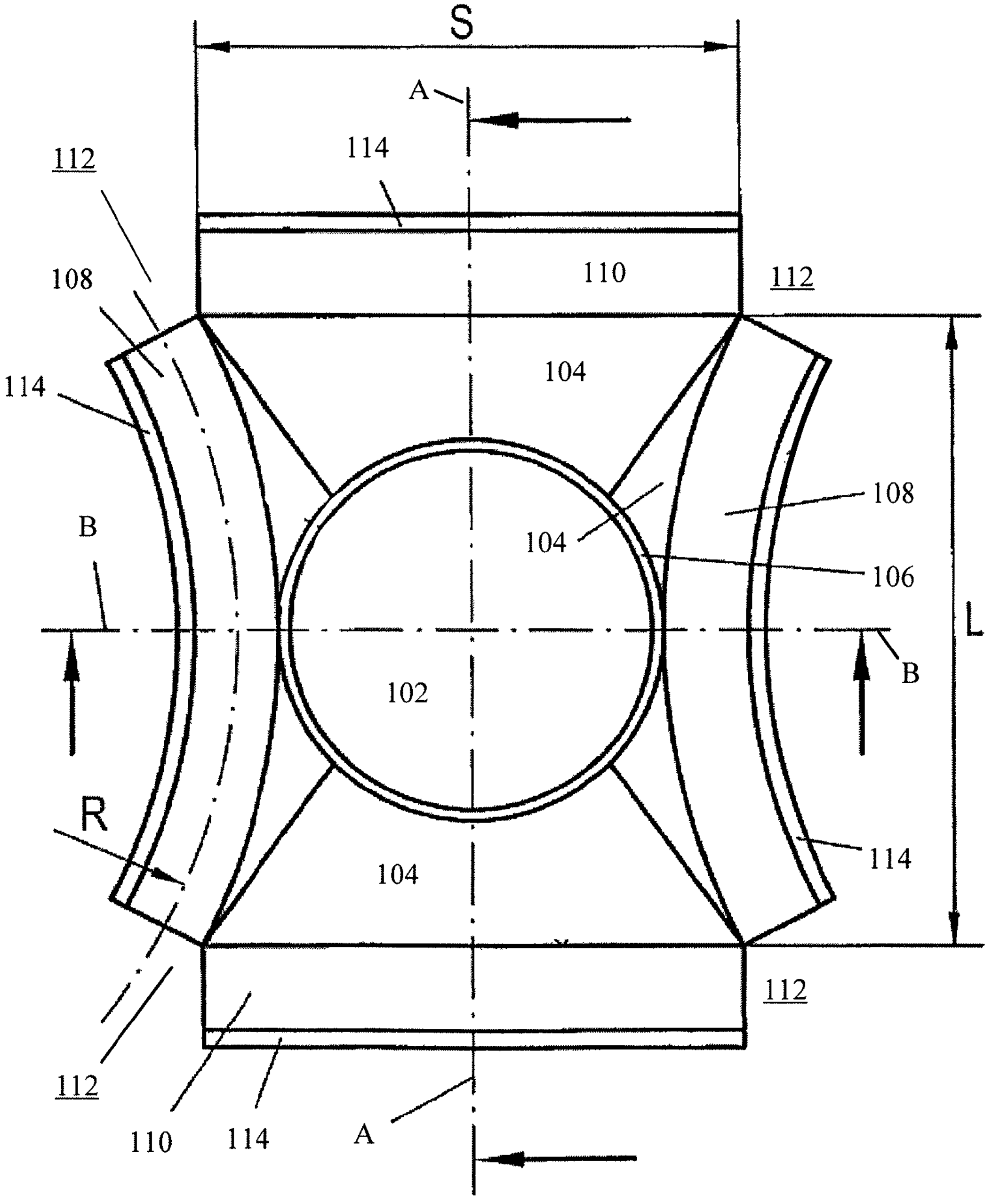
FIG. 2 is a top plan view of the transducer membrane of FIG. 1.

FIG. 2 is a top plan view of the transducer membrane of FIG. 1. In FIG. 2, the periphery segment 108 has a length L and the periphery segment 110 has a length S. The length L may range between about 7 mm and about 100 mm, and more particularly may be between about 30 mm and about 70 mm. In some implementations, a ratio of periphery segment lengths (e.g., L/S) may range between about 1 and about 2. In other implementations, the ratio of periphery lengths may be less than 1 or may be greater than 2, such as about 5.

FIG. 2 also shows a radius of curvature, R, of a periphery segment (e.g., 108). The radius of curvature may be measured from about the middle of the periphery segment. In some implementations, a periphery segment with curvature may have a radius of curvature that ranges between about half the length of the periphery segment (e.g., about 0.5 L) and about twenty times the length of the periphery segment (e.g., about 20 L). It is to be noted that in some implementations, periphery segment 110 may be curved in the footprint plane, and periphery segment 108 may be linear. In yet other implementations, periphery segments 108 and 110 may be curved in the footprint plane.

Figure 3:
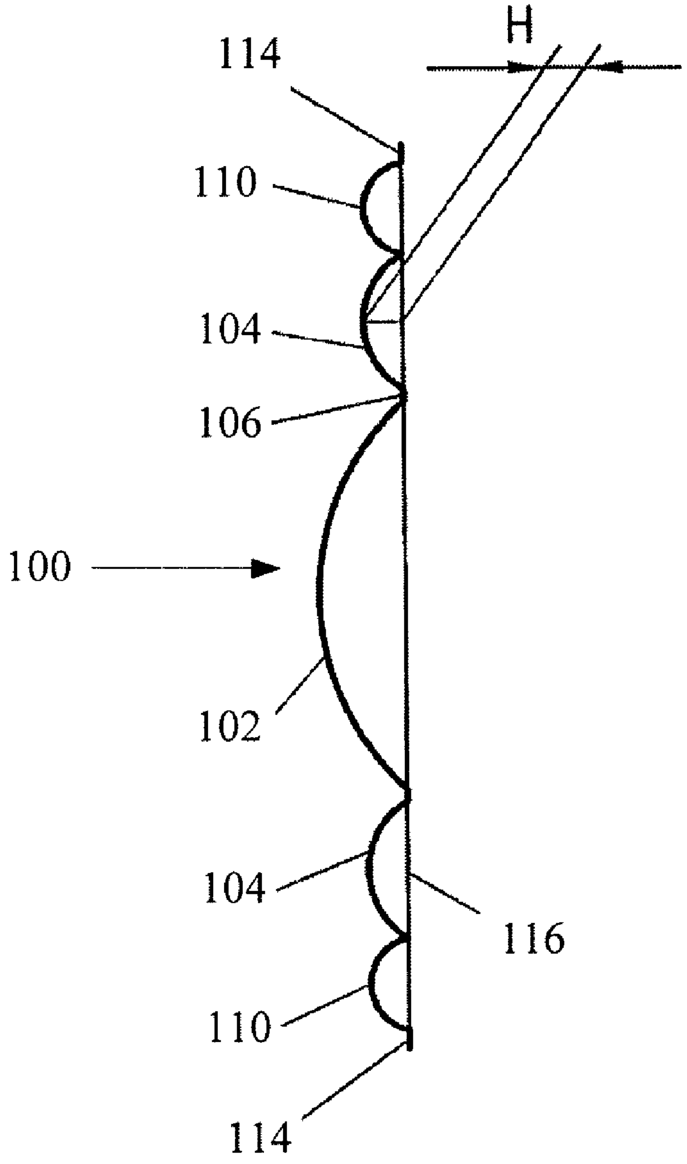
FIG. 3 is a side view of the transducer membrane of FIG. 2 along line A-A.

FIG. 3 is a side view of the transducer membrane 100 of FIG. 2 along line A-A. The intermediate membrane 104 may have a height H, measured from the footprint plane 116. The footprint plane 116 may be the plane in which the outmost edges of the periphery segments lie or the plane in which the coil is coupled, fastened, clamped or otherwise attached to the underside of the transducer membrane 100. In implementations in which the transducer membrane footprint 116 is generally rectangular, the height, H, of the intermediate membrane 104 may range between about 0 mm and about half of the length of a periphery segment (e.g., periphery segment 110). In other implementations, the intermediate membrane 104 may have larger heights.

Figure 4:
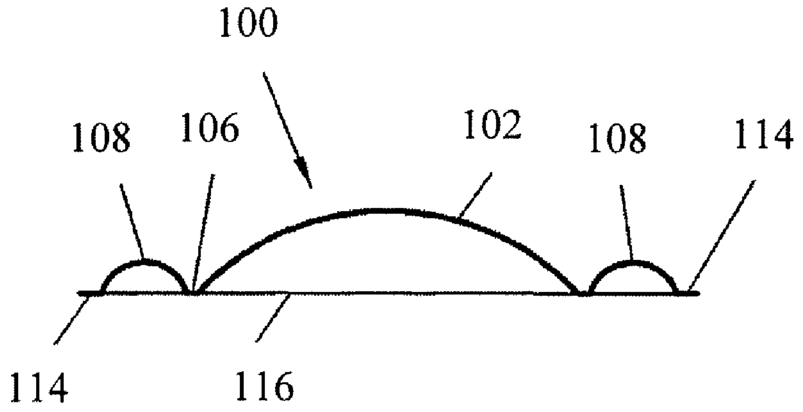
FIG. 4 is a side view of the transducer membrane of FIG. 2 along line B-B.

FIG. 4 is a side view of the transducer membrane 100 of FIG. 2 along line B-B. In FIG. 4, periphery segments 108 may approach the dome 102 and may almost reach, meet, join, merge, or connect with the dome 102 or the groove/ring 106. In other implementations, more or less space may exist between periphery segment 108 and the dome 102 or the grove/ring 106.

The intermediate membrane 104 and the periphery portions 108 and 110 may have thicknesses that are about equal. The thicknesses may depend on a resonance frequency. In one implementation, the periphery portion 108 and 110 may have thicknesses that range between about 20 μm and about 80 μm. In other implementations smaller or larger material thicknesses may be employed.

The transducer membrane 100 may be formed from polycarbonate materials, such as Macrofol or Pokalon. Alternatively, the transducer membrane 100 may consist of polyester (Mylar), polyimide (Kapton), or polypropylene (Daplen). Composite materials are also suitable, including carbonate, polycarbonate, and polyurethane. In some implementations, metals such as beryllium, copper, titanium, or aluminum may be employed.

The coil and the transducer membrane 100 may form the mass in a spring-mass system. Each part of the transducer membrane 100, including the dome 102, the intermediate membrane 104, and/or the periphery segments (e.g., 108 and 110), may act as mechanical springs in the spring-mass system. Individually, each of these different parts of the transducer membrane 100 may act as a non-linear spring interacting at its border with a neighboring spring or springs. When a periphery includes periphery segments having curvature (e.g., 108) the interactions between a periphery segment and the intermediate membrane 104 may be modeled and analyzed as two series connected springs. When a static or harmonic force is applied through the coil the membrane is deflected. In the case of a harmonic force, a frequency below the resonance frequency is chosen to drive the transducer membrane 100. Below the resonance frequency, the behavior of the spring-mass system is determined by the spring properties.

The spring properties may be established by setting the curvature, in the footprint plane 116, of symmetrical periphery segments. The curvature influences the deformation behavior of the intermediate membrane 104 and both the curved and linear periphery segments. The deformation behavior may be established to impart evenly increasing deformation from an edge of the transducer membrane 100 toward the center of the transducer membrane 100. In other words, the distribution of deformation over several parts of the transducer membrane 100 produces a substantially uniform deformation in the transducer membrane 100. The substantially uniform deformation linearizes mechanical compliance of the transducer membrane 100. Linearizing mechanical compliance of the transducer membrane 100 helps to reduce, and may minimize or substantially minimize, acoustical distortions, such as harmonic distortions and/or intermodulation distortions, in the transducer membrane 100.

Figure 5:
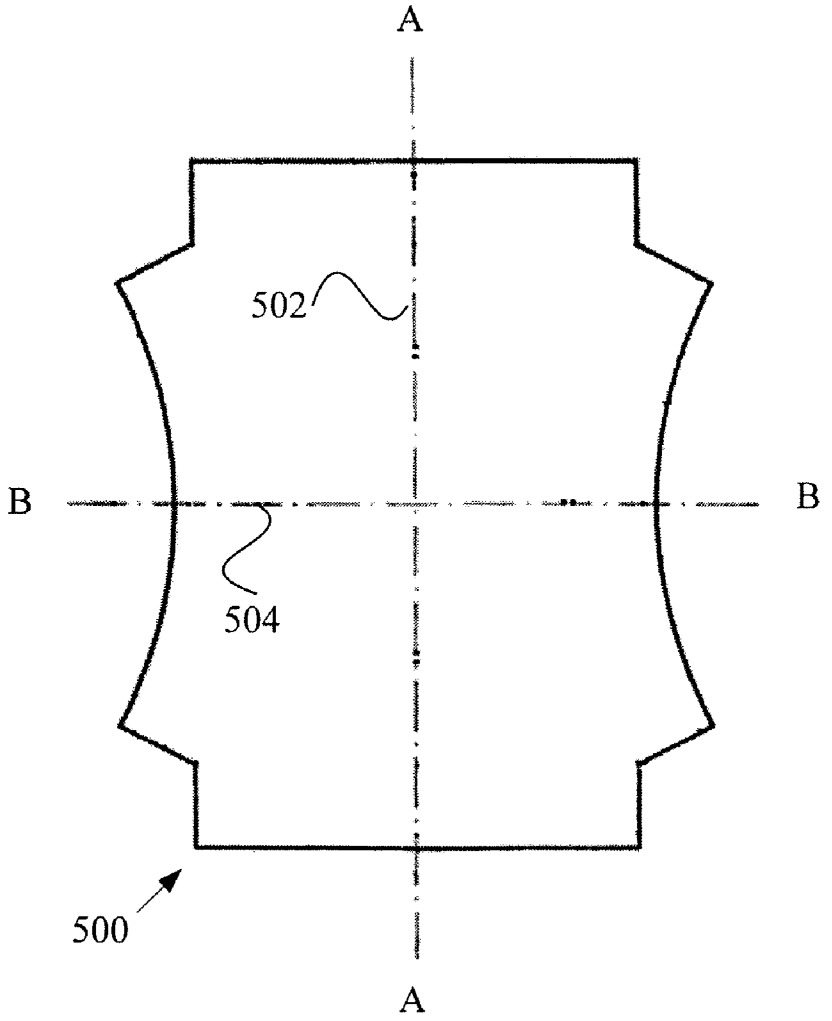
FIG. 5 is a top plan view of a non-circular transducer membrane footprint.

FIG. 5 is a top plan view of a non-circular transducer membrane footprint 500. In FIG. 5, the transducer membrane footprint 500 is generally rectangular. In FIG. 5, the transducer membrane footprint 500 includes two planes of symmetry, axis A 502 and axis B 504. One half of the transducer membrane footprint 500 is a mirror image of its other half when viewed with respect to axis A 502 or axis B 504. That is, the lengths, angles, and curvatures of the transducer membrane 500 on one side of axis A 502 or axis B 504 generally mirror the corresponding portion on the other side of axis A 502 or axis B 504.

Figure 6:
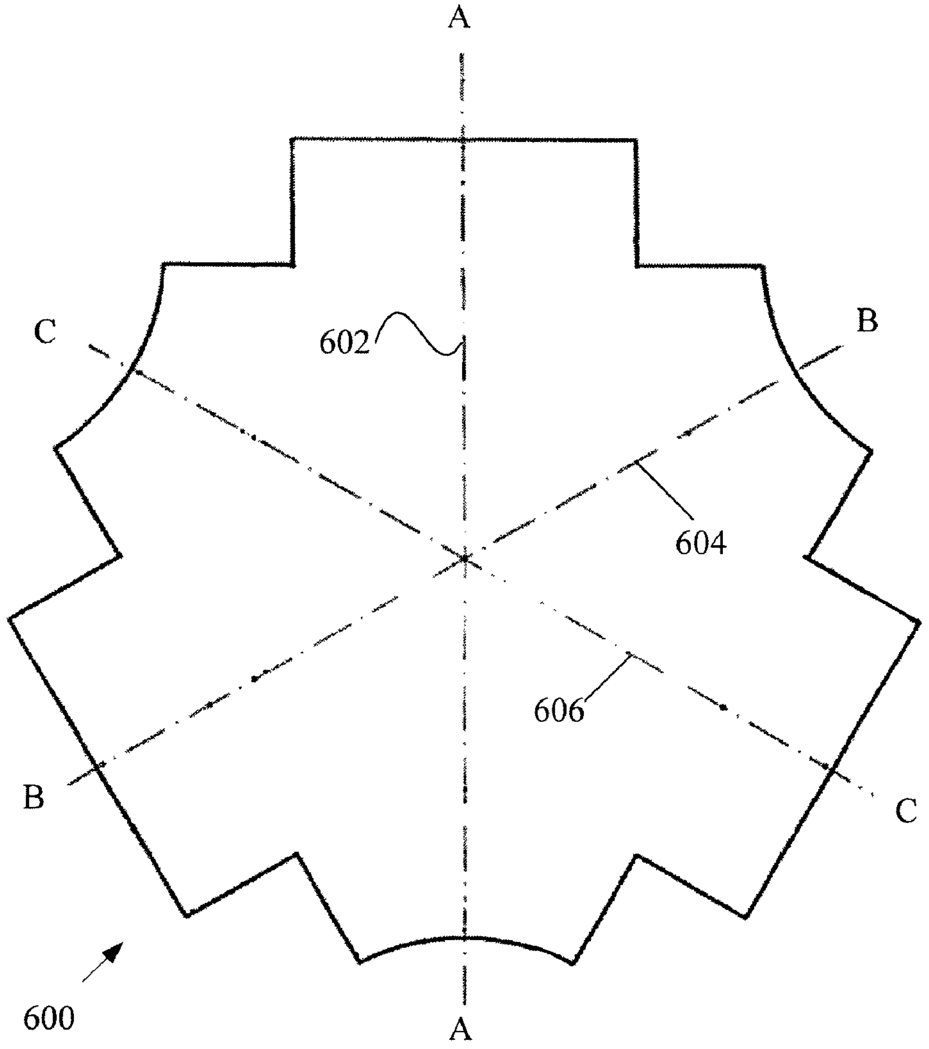
FIG. 6 is a top plan view of a second non-circular transducer membrane footprint.

FIG. 6 is a top plan view of a second non-circular transducer membrane footprint 600. In FIG. 6, the transducer membrane footprint 600 generally resembles a hexagonal shape including curved and straight edges. In FIG. 6, the transducer membrane footprint 600 includes three planes of symmetry, axis A 602, axis B 604, and axis C 606. The transducer membrane footprint 600 is symmetrical about axis A 602, in that the portion of the transducer membrane footprint 600 on one side of axis A 602 generally mirrors the portion of the transducer membrane footprint 600 on the other side of axis A 602. The transducer membrane footprint 600 is symmetrical about axis B 604, in that the portion of the transducer membrane footprint 600 on one side of axis B 604 generally mirrors the portion of the transducer membrane footprint 600 on the other side of axis B 604. The transducer membrane footprint 600 is symmetrical about axis C 606, in that the portion of the transducer membrane footprint 600 on one side of axis C 606 generally mirrors the portion of the transducer membrane footprint 600 on the other side of axis C 606.

A transducer membrane footprint may include other non-circular regular or irregular polygonal shapes that include at least one axis of symmetry. As examples, the shapes may be square, rectangle, pentagon, triangle, trapezoid, parallelogram, rhombus, deltoid, octagon, hexagon, or other shapes.

Figure 7:
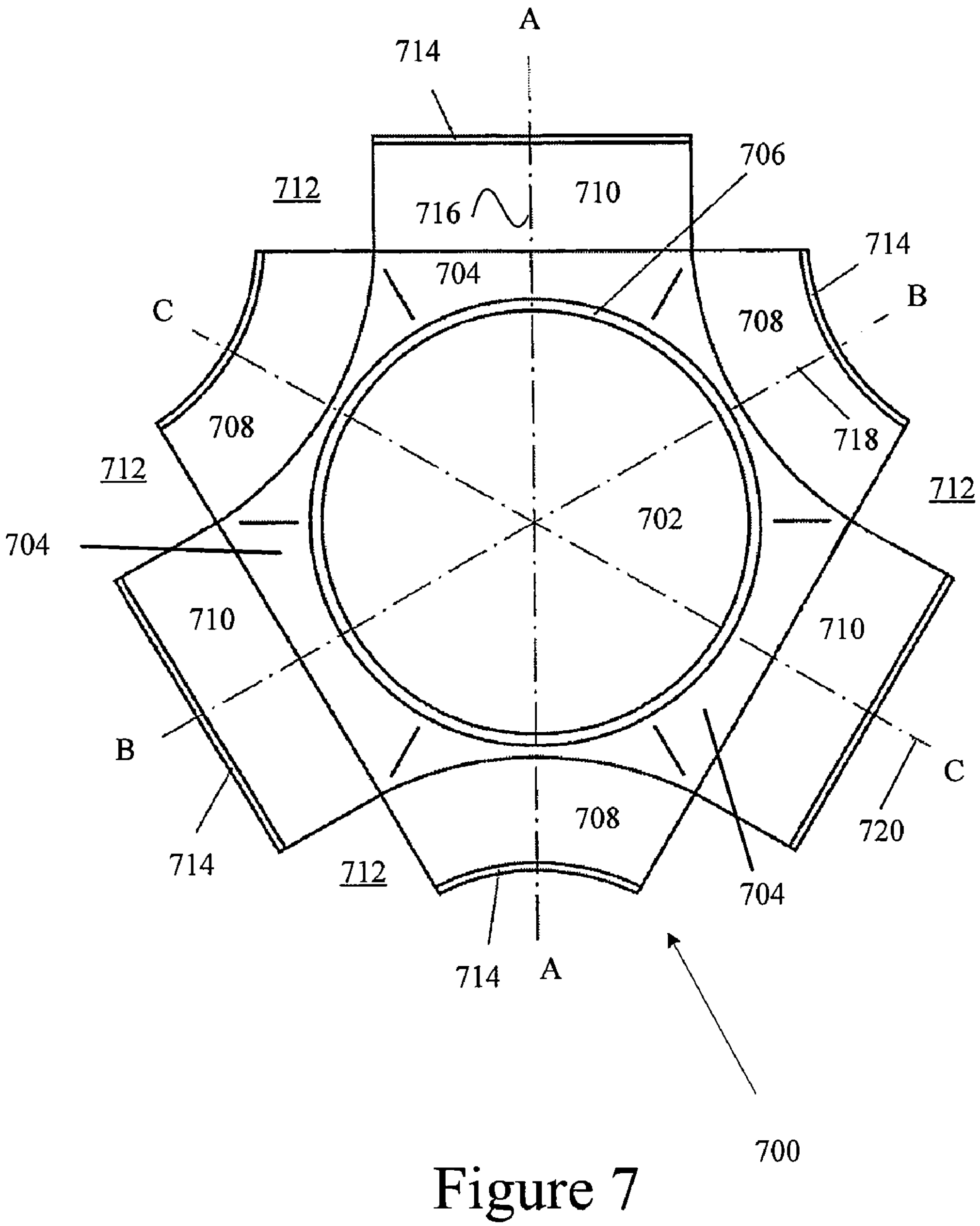
FIG. 7 is a top plan view of a second transducer membrane.

FIG. 7 is a top plan view of a second transducer membrane 700. Transducer membrane 700 has a generally hexagonal footprint as shown in FIG. 6. The transducer membrane 700 includes a dome 702 that may be positioned near the center, or in other locations, of the transducer membrane 700. An intermediate membrane 704 may be formed around or coupled to some/or all of the dome 702, and may be delineated by a grove or ring 706. A periphery may surround the intermediate membrane 704 to define a non-circular footprint around the intermediate membrane 704. The periphery may include periphery segments 708 and 710. The periphery segments 708 and 710 may include an adhesive edge 714. Periphery segments 708, as shown in FIG. 7, are symmetrically curved, in the footprint plane, with respect to one another. The periphery may also include periphery comers 712. The periphery corners may be at a location along the periphery where two periphery segments meet or end. In some applications, the periphery corners 712 may be open. In other implementations, the periphery corners 712 may be closed with transducer material that forms a continuous or discontinuous extension of the periphery segments to transition from one segment to the next. The transducer material closing the periphery corners 712 may be a membrane or a membrane like material that may include ridges and/or grooves. The ridges and/or grooves may reduce acoustic short-circuit artifacts, and may be included, for example, when an acoustical short-circuit is noticeable in the emitted sound filed. The decision to close the periphery corners 712 may depend on the extent to which an acoustical short circuit is noticeable in an emitted sound field.

The transducer membrane 700 shown in FIG. 3 has three planes of symmetry, axis A 716, axis B 718, and axis C 720. Independent of the selected plane of symmetry, at least two of the periphery segments 708 that are curved are symmetrical to one another. The remaining third periphery segment 708 has symmetrical curvature around the axis through the third periphery segment (sometimes described as having curvature symmetrical to itself).

Figure 8:
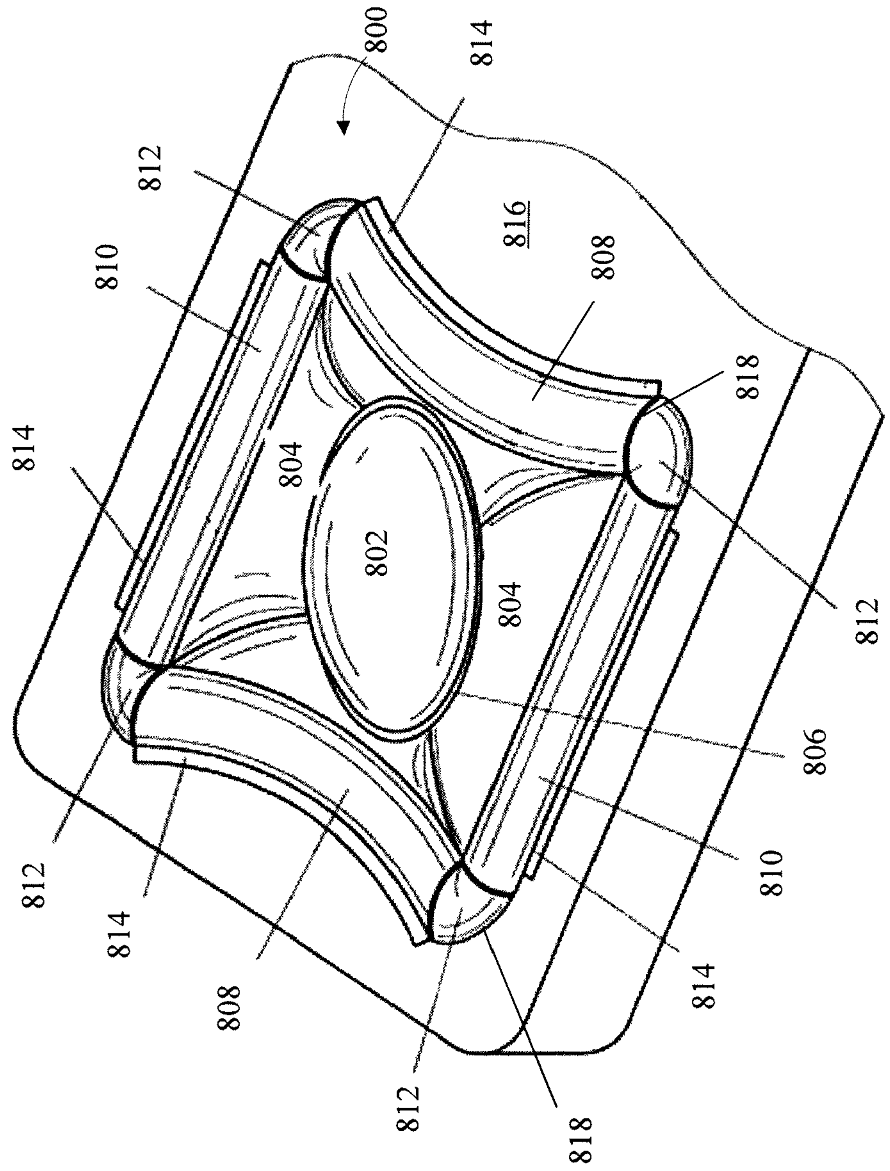
FIG. 8 is a transducer membrane in a frame.

FIG. 8 is a transducer membrane in a frame. In FIG. 8, the transducer membrane 800 has a generally rectangular shape. The transducer membrane 800 includes a dome 802 that is positioned near a center of the transducer membrane 800. An intermediate membrane 804 is formed around or coupled to some/or all of the dome 802, and is delineated by a groove or ring 806. The periphery surrounding the intermediate membrane 804 extends around the intermediate membrane 804 to define a generally rectangular transducer membrane footprint. The periphery includes periphery segments 808 and 810. As shown in FIG. 8, periphery segments 808 are curved in the transducer membrane footprint plane and are symmetrical to one another. With respect to the dome 802, periphery segments 808 are convexly curved. In FIG. 8, the transducer membrane 800 is fixed at edges 814 to the frame 816. Edges 814 may be fixed to the frame 816 through the use of adhesive, a fastener, clamp, or other coupling. In FIG. 8, periphery corners 812 are open, and frame protrusions 818 nearly fill the periphery corners 812 on a base surface as well as along the edges of the periphery segments so that the transducer membrane 800 is almost touching the frame protrusions 818. Additionally, the frame protrusions 818 are configured such that the transducer membrane 800 along the periphery corners 812 does not further separate from the frame protrusions 818 during the reproduction of sound. These frame protrusions 818 may reduce acoustic short circuits during the reproduction of sound.

Figure 9:
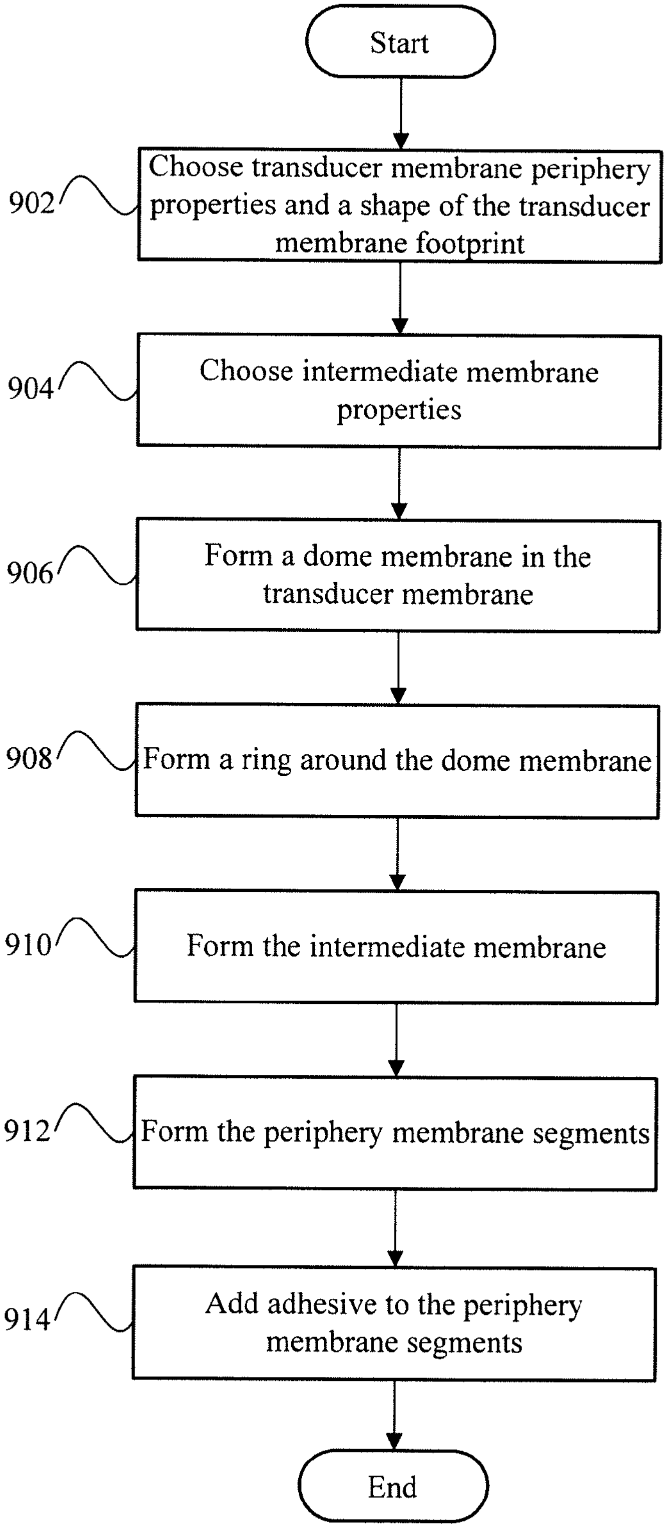
FIG. 9 is a flow diagram for fabricating a transducer membrane.

FIG. 9 is a flow diagram for fabricating a transducer membrane. The transducer membrane may be formed from a single sheet of membrane material using a heat molding process. In yet other fabrications, the transducer membrane may be formed in other manners.

A designer or processor determines the membrane periphery properties and shape (902). The properties may include membrane material, thickness, variation in thickness, curvature, height, width, periphery segment size and shape, transducer membrane footprint size and shape, or other properties. The intermediate membrane properties and shape are also determined (904). The properties may include intermediate membrane material, thickness, variation in thickness, curvature, height, width, shape, or other properties.

A dome is formed in the transducer membrane (906). A ring or groove may be formed in the transducer membrane around the dome (908). The dome may be centrally located, or may be located in other positions of the transducer membrane.

The intermediate membranes are formed around the dome or the ring or groove (910). A periphery defining a non-circular footprint of the transducer membrane is formed around the intermediate membrane (912). The periphery includes periphery segments positioned between periphery corner locations. At least two periphery segments are curved in the transducer membrane plane symmetrically along one or more axes with respect to one another and/or the dome. The curvature in the transducer membrane plane of a periphery segment may be convex and/or concave with respect to the dome. In some implementations, the radius of curvature of a periphery segment ranges between about one half to about twenty times the length of the periphery segment.

A small section of the periphery segments may be formed to act as an adhesive edge. Adhesive may be added to the adhesive edge of the periphery segments (914). The adhesive edge may facilitate installation of the transducer membrane in a device employing sound reproduction circuitry. Alternatively, other fasteners may be employed to install the transducer membrane.

The transducer membrane with symmetrical curvature linearizes transducer membrane deformations, thereby reducing acoustical distortions. These reductions may enhance sound reproductions in an emitted sound field, and improve a listener's experience.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A transducer membrane, comprising:

a dome;

an intermediate membrane formed adjacent to the dome;

and a periphery that surrounds the intermediate membrane, the periphery defining a non-circular footprint around the intermediate membrane, the periphery comprising:

a first periphery corner;

a second periphery corner;

a first periphery segment comprising a deformation linearizing curvature, the deformation linearizing curvature comprising a curved surface that extends upward from a footprint plane of the transducer membrane and that further comprises an arcuate edge, where a radius of the arcuate edge bisects a center of the dome, and where the first periphery segment is disposed between the first corner and the second corner; and a second periphery segment comprising symmetrical curvature with respect to the first periphery segment about a vertical plane that bisects the center of the dome.

2. The transducer membrane of claim 1, where the arcuate edge is convex with respect to the dome.

3. The transducer membrane of claim 1, where the arcuate edge is concave with respect to the dome.

4. The transducer membrane of claim 1, further comprising a third periphery segment adjacent to the first periphery corner, where the first periphery segment comprises a first length, and the third periphery segment comprises a second length, and where a ratio of the first length to the second length is between about 1 and about 2.

5. The transducer membrane of claim 4, where the intermediate membrane comprises a height that is less than about half of the second length.

6. The transducer membrane of claim 1, where the first periphery segment comprises a first length L, and where the first periphery segment has a radius of curvature R satisfying 0.5 L<R<20 L.

7. The transducer membrane of claim 1, where the non-circular footprint comprises a generally four-sided shape.

8. The transducer membrane of claim 7, where the non-circular footprint comprises a square.

9. The transducer membrane of claim 7, where the non-circular footprint comprises a rectangle.

10. The transducer membrane of claim 1, where the non-circular footprint comprises a hexagon.

11. The transducer membrane of claim 1, where the intermediate membrane and the periphery have a substantially uniform thickness.

12. The transducer membrane of claim 1, where the deformation linearizing curvature comprises intermediate membrane deformation linearizing curvature.

13. A transducer membrane, comprising:

a dome;

an intermediate membrane coupled to the dome; and a periphery coupled to the intermediate membrane, the periphery comprising straight non-corner periphery segments, a first curved non-corner periphery segment, and a second curved non-corner periphery segment, arranged to form a substantially rectangular shape, and where the first and the second curved non-corner periphery segments are symmetrical to one another and a curvature of each of the first curved non-corner periphery segment and the second curved non-corner periphery segment comprise a curved surface that extends upward from a footprint plane of the transducer membrane and that further comprises an arcuate edge where a radius of the arcuate edge bisects a center of the dome.

14. The transducer membrane of claim 13, where the arcuate edge of the first and the second curved non-corner periphery segments are convexly curved with respect to the dome.

15. The transducer membrane of claim 13, where the arcuate edge of the first and the second curved non-corner periphery segments are concavely curved with respect to the dome.

16. The transducer membrane of claim 13, where the first curved non-corner periphery segment comprises a length L, and where the first curved non-corner periphery segment has a radius of curvature R satisfying 0.5 L<R<20 L.

17. The transducer membrane of claim 13, where the first straight non-corner periphery section comprises a length S, and where the intermediate membrane comprises a height that is less than about 0.5 S.

18. The transducer membrane of claim 13, further comprising closed periphery corners.

19. The transducer membrane of claim 13, where the intermediate membrane, the periphery comprise a substantially uniform thickness.

20. A method of fabricating a transducer membrane, comprising:

forming a dome;

forming an intermediate membrane coupled to the dome; and forming a periphery coupled to the intermediate membrane, the periphery defining a non-circular footprint around the intermediate membrane, comprising:

forming a first periphery corner;

forming a second periphery corner;

forming a first periphery segment with a deformation linearizing curvature, the deformation linearizing curvature comprising a curved surface that extends upward from a footprint of the transducer membrane and that further comprises an arcuate edge, where a radius of the arcuate edge bisects a center of the dome, and where the first periphery segment is disposed between the first corner and the second corner; and forming a second periphery segment comprising symmetrical curvature with respect to the first periphery segment about a vertical plane that bisects the center of the dome.

21. The method of claim 20, where the arcuate edge is convex with respect to the dome.

22. The method of claim 20, where the arcuate edge is concave with respect to the dome.

23. The method of claim 20, where the first periphery segment and the second periphery segment are symmetrical to one another about more than one axis of symmetry.

24. The method of claim 20, where the first periphery segment comprises a length L and where the act of forming the periphery further comprises forming the first periphery segment with a radius of curvature that ranges between about 0.5 L and about 20 L.

25. The method of claim 20, where the act of forming the periphery comprises forming a square transducer membrane footprint.

26. The method of claim 20, where the act of forming the periphery comprises forming a rectangular transducer membrane footprint.

27. The method of claim 20, where the act of forming the periphery comprises forming a hexagonal transducer membrane footprint.

* * * * *